(12) United States Patent
Park

(10) Patent No.: US 10,136,089 B2
(45) Date of Patent: Nov. 20, 2018

(54) DISPLAY PANEL, DISPLAY DEVICE AND METHOD FOR MAKING THE SAME

(71) Applicant: BOE TECHNOLOGY GROUP CO., LTD., Beijing (CN)

(72) Inventor: Hanjun Park, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/527,304

(22) PCT Filed: Jun. 29, 2016

(86) PCT No.: PCT/CN2016/087595
§ 371 (c)(1),
(2) Date: May 16, 2017

(87) PCT Pub. No.: WO2017/148056
PCT Pub. Date: Sep. 8, 2017

(65) Prior Publication Data
US 2018/0077371 A1    Mar. 15, 2018

(30) Foreign Application Priority Data

Mar. 4, 2016   (CN) .......................... 2016 1 0124957

(51) Int. Cl.
*H04N 5/369*      (2011.01)
*H01L 27/12*      (2006.01)
(Continued)

(52) U.S. Cl.
CPC ............. *H04N 5/3696* (2013.01); *G09G 3/30* (2013.01); *H01L 27/124* (2013.01);
(Continued)

(58) Field of Classification Search
CPC .... H04N 5/3696; H04N 5/378; H04N 5/3745; H04N 5/23293; H04N 5/3765;
(Continued)

(56) References Cited

U.S. PATENT DOCUMENTS 7,242,449 B1 *   7/2007   Yamazaki ............. G02F 1/1362
                                                     257/E27.111
7,898,585 B2     3/2011   Nam
(Continued)

FOREIGN PATENT DOCUMENTS

CN          1678950 A      10/2005
CN          1800923 A       7/2006
(Continued)

OTHER PUBLICATIONS

English translation of International Search Report and Written Opinion dated Dec. 1, 2016, for corresponding PCT Application No. PCT/CN2016/087595.

(Continued)

*Primary Examiner* — Albert Cutler
(74) *Attorney, Agent, or Firm* — Kinney & Lange, P.A.

(57) ABSTRACT

A display panel, a display device including the same and a method for making the display panel are disclosed in the embodiments of the disclosure. The display panel includes: a drive module and a plurality of pixel units. Each pixel unit of the plurality of pixel units has a plurality of sub-pixel units and a plurality of image sensing units, each of the plurality of sub-pixel units being corresponding to each of the plurality of image sensing units respectively; each sub-pixel unit of the plurality of pixel units and each image sensing unit of the plurality of image sensing units are connected to the drive module, each sub-pixel unit being arranged to be adjacent to an image sensing unit corresponding thereto; and the drive module is configured to drive the (Continued)

plurality of image sensing units so as to take images, and to drive the plurality of sub-pixel units as so to display the images.

10 Claims, 3 Drawing Sheets

(51) Int. Cl.
    *H04N 5/378*     (2011.01)
    *G09G 3/30*     (2006.01)
    *H01L 31/153*     (2006.01)
    *H04N 5/3745*     (2011.01)
    *H04N 5/232*     (2006.01)
    *H04N 5/376*     (2011.01)

(52) U.S. Cl.
    CPC ........ *H01L 27/1262* (2013.01); *H01L 31/153* (2013.01); *H04N 5/23293* (2013.01); *H04N 5/378* (2013.01); *H04N 5/3745* (2013.01); *G09G 2300/0426* (2013.01); *G09G 2300/0469* (2013.01); *G09G 2310/08* (2013.01); *H04N 5/3765* (2013.01)

(58) Field of Classification Search
    CPC . H01L 27/124; H01L 31/153; H01L 27/1262; G09G 3/30; G09G 2300/0426; G09G 2300/0469; G09G 2310/08; G09G 2300/0456; G09G 2300/0439; G06F 3/0412; G06F 3/042
    See application file for complete search history.

(56) References Cited

U.S. PATENT DOCUMENTS

| | | | |
|---|---|---|---|
| 8,520,114 B2 | 8/2013 | Cok et al. | |
| 9,806,134 B2 | 10/2017 | Hwang | |
| 2004/0217357 A1* | 11/2004 | Zhang | G02F 1/13454 257/72 |
| 2009/0283772 A1* | 11/2009 | Cho | H01L 27/1446 257/71 |
| 2010/0026636 A1* | 2/2010 | Jang | G02F 1/13338 345/173 |
| 2012/0001878 A1* | 1/2012 | Kurokawa | G06F 3/0412 345/204 |
| 2015/0302793 A1* | 10/2015 | In | G09G 3/3208 345/211 |
| 2016/0241760 A1* | 8/2016 | Law | G06F 1/1686 |
| 2017/0142360 A1* | 5/2017 | Goto | H04N 5/3696 |

FOREIGN PATENT DOCUMENTS

| | | |
|---|---|---|
| CN | 101944323 A | 1/2011 |
| CN | 102760405 A | 10/2012 |
| CN | 103582948 A | 2/2014 |
| CN | 104091559 A | 10/2014 |
| CN | 104853080 A | 8/2015 |
| CN | 205385024 A | 7/2016 |
| KR | 20080024662 A | 3/2008 |

OTHER PUBLICATIONS

International Search Report and Written Opinion dated Dec. 1, 2016, for corresponding PCT Application No. PCT/CN2016/087595.

First Chinese Office Action, for Chinese Patent Application No. 201610124957.6, dated Feb. 5, 2018, 12 pages.

Second Chinese Office Action dated Sep. 26, 2018, for corresponding Chinese Application No. 201610124957.6.

* cited by examiner forming a plurality of sub-pixel units and a plurality of image sensing units within an area corresponding to each pixel unit on a substrate ⎯ 101 setting each of the plurality of the sub-pixel units to connect with a drive module, and connecting each of the plurality of image sensing units with the drive module ⎯ 102

DISPLAY PANEL, DISPLAY DEVICE AND METHOD FOR MAKING THE SAME

CROSS-REFERENCE TO RELATED INVENTION

The present disclosure claims the benefit of Chinese Patent Application Invention No. 201610124957.6 filed on Mar. 4, 2016 in the State Intellectual Property Office of China, the whole disclosure of which is incorporated herein by reference.

BACKGROUND OF THE INVENTION

Field of the Invention

Embodiments of the present disclosure relate to the technical field of processing of a display, and in particular, to a display panel, a display device and a method for making the same.

Description of the Related Art

There are a variety of display panels, e.g., an EL (electroluminescent) display panel which is capable of converting electric energy into light energy with a light-emitting material upon energization. Nowadays, the EL display panel is widely used, e.g., display devices such as phone and tablet computer and the like formed by the EL display panel.

Current EL display panel typically comprises a drive module and a plurality of pixel units, each pixel unit comprising a plurality of sub-pixel units and each sub-pixel unit being electrically connected with the drive module, the drive module displaying pictures by controlling sub-pixel units contained within each pixel unit.

In addition to the display panel contained within current display device, the display device further comprises e.g., a camera which is used to take images and to transmit the images towards the drive module of the display panel, the drive module in turn displaying the images by controlling sub-pixel units contained within each pixel unit.

During a process of implementing embodiments of the disclosure, it has been found that at least following question (s) exist in the prior art, i.e., it is necessary to arrange a camera additionally on the display device to implement the function of taking images; however, the price of the camera is relatively expensive and thus increases the production cost of the display device.

SUMMARY OF THE INVENTION

The embodiments of the present disclosure have been made to overcome or alleviate at least one aspect of the above mentioned disadvantages and/or shortcomings in the prior art. According to an aspect of the exemplary embodiment of the present disclosure, there is provided a display panel.

In an exemplary embodiment of the disclosure, the display panel comprises a drive module and a plurality of pixel units; each pixel unit of the plurality of pixel units has a plurality of sub-pixel units and a plurality of image sensing units, each of the plurality of sub-pixel units being corresponding to each of the plurality of image sensing units respectively; each sub-pixel unit of the plurality of sub-pixel units and each image sensing unit of the plurality of image sensing units are connected to the drive module, each sub-pixel unit being arranged to be adjacent to an image sensing unit corresponding thereto; and the drive module is configured to drive the plurality of image sensing units so as to take images, and to drive the plurality of sub-pixel units as so to display the images.

According to a further exemplary embodiment, the display panel may further comprise a plurality of gate lines, a plurality of data lines and a plurality of read-out lines; each image sensing unit is connected to two adjacent gate lines and to one adjacent read-out line; and each sub-pixel unit is connected to one of the two adjacent gate lines and to one adjacent data line.

According to a further exemplary embodiment, each image sensing unit may comprise a first transistor, a second transistor and an image sensing layer; a gate of the first transistor is connected to the one of the two adjacent gate lines, a first electrode of the first transistor is connected to the image sensing layer and a second electrode of the first transistor is connected to a common electrode of the display panel; and a first electrode of the second transistor is connected to the image sensing layer, a second electrode of the second transistor is connected to the one read-out line and a gate of the second transistor is connected to the other one of the two adjacent gate lines.

According to a further exemplary embodiment, the image sensing layer may comprise a first electrode layer, a quantum film layer and a second electrode layer, and the quantum film layer is located between the first electrode layer and the second electrode layer, the first electrode layer is connected with the first electrode of the first transistor and the first electrode of the second transistor respectively, and the first electrode layer and the second electrode layer are connected with both ends of a power supply respectively.

According to a further exemplary embodiment, each sub-pixel unit may comprise a third transistor and a display layer, and a gate of the third transistor is connected to the one of the two adjacent gate lines, a first electrode of the third transistor is connected to the one adjacent data line, and a second electrode of the third transistor is connected to the display layer.

According to a further exemplary embodiment, the display layer may comprise a third electrode layer, a light-emitting layer, and a fourth electrode layer, and the light-emitting layer is located between the third electrode layer and the fourth electrode layer, the third electrode layer is connected to the second electrode of the third transistor; and the third electrode layer and fourth electrode layer are connected with both ends of the power supply respectively.

According to a further exemplary embodiment, the drive module may comprise a timing controller, a gate line integrated circuit, a data line integrated circuit and an image sensing read-out line integrated circuit; the timing controller is electrically connected with the gate line integrated circuit, the data line integrated circuit, the image sensing read-out line integrated circuit, and the gate line integrated circuit is connected with the plurality of gate lines, the data line integrated circuit is connected with the plurality of data lines and the image sensing read-out integrated circuit is connected with the plurality of read-out lines.

According to another aspect of the exemplary embodiment of the present disclosure, there is provided a display device.

In an exemplary embodiment of the disclosure, the display device may comprise the display panel as mentioned in any one of above exemplary embodiments.

According to another aspect of the exemplary embodiment of the present disclosure, there is provided a method for making a display panel.

In an exemplary embodiment of the disclosure, the method may comprise steps of: forming a plurality of sub-pixel units and a plurality of image sensing units within an area corresponding to each pixel unit on a substrate, the plurality of sub-pixel units being corresponding to the plurality of the image sensing units respectively, and each sub-pixel unit being arranged to be adjacent to its corresponding image sensing unit; connecting each of the plurality of the sub-pixel units with a drive module, and connecting each of the plurality of image sensing units with the drive module.

According to a further exemplary embodiment, the step of forming the plurality of sub-pixel units and the plurality of image sensing units within the area corresponding to each pixel unit on the substrate may comprise: forming a first transistor, a second transistor and a third transistor within the area corresponding to each pixel unit on the substrate; forming a passivation layer on the first transistor, the second transistor and the third transistor; and forming an image sensing layer and a display layer on the passivation layer, and connecting the image sensing layer with the first transistor and the second transistor respectively and connecting the display layer with the third transistor.

According to a further exemplary embodiment, the step of forming the plurality of sub-pixel units and the plurality of image sensing units within the area corresponding to each pixel unit on the substrate may comprises: forming a plurality of gate lines, a plurality of data lines and a plurality of read-out lines simultaneously when forming the first transistor, the second transistor and the third transistor.

According to a further exemplary embodiment, the step of forming the image sensing layer and the display layer on the passivation layer may comprise: forming a first electrode layer and a third electrode layer on the passivation layer, and connecting the first electrode layer with the first transistor and the second transistor respectively, and connecting the third electrode layer with the third transistor; forming a quantum film layer on the first electrode layer; forming a light-emitting layer on the third electrode layer; and forming a second electrode layer on the quantum film layer and forming a fourth electrode layer on the light-emitting layer.

According to a further exemplary embodiment, the image sensing layer may be formed by a mask exposure process.

There are several beneficial technical effects brought about by the technical solutions provided by the exemplary embodiments, as follows:

By providing an image sensing unit in each sub-pixel unit and by connecting each image sensing unit with a drive module, the drive module may control the image sensing unit to sense external images, i.e., to take images/photos of external images; and the image sensing unit may produce/induce a current signal when it senses lights from external images and send such current signal towards the drive module which then converts the current signal into a digital signal, and depending on such digital signal, controls the plurality of sub-pixel units to display the images. As such, it is not necessary to provide a camera on a display device, resulting in a decreased cost.

BRIEF DESCRIPTION OF THE DRAWINGS

The above and other features and advantages of the present disclosure will become more apparent and a more comprehensive understanding of the present disclosure can be obtained, by describing in detail exemplary embodiments thereof with reference to the accompanying drawings, in which.

DETAILED DESCRIPTION OF PREFERRED EMBODIMENTS OF THE INVENTION

Figure 1:
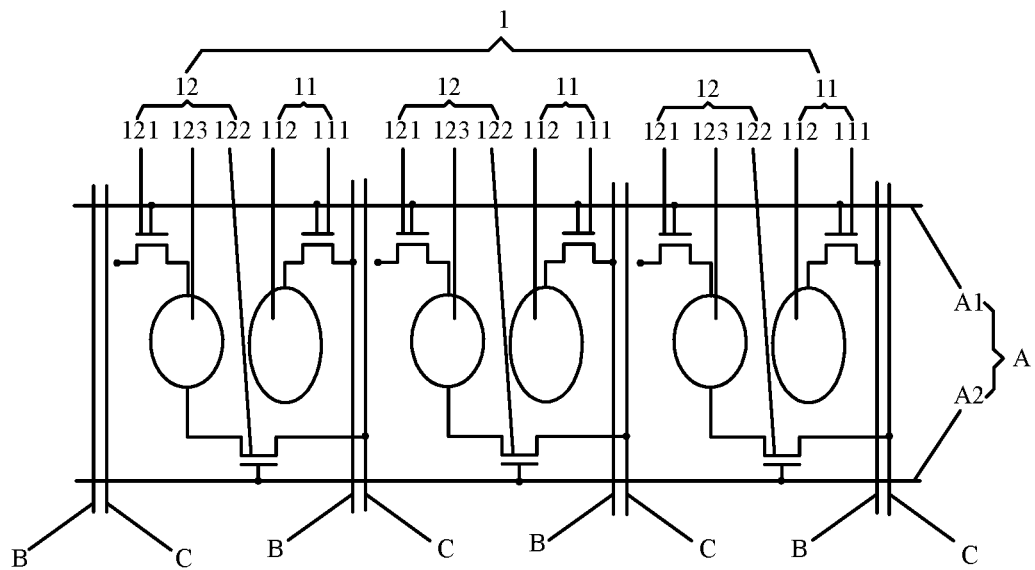
FIG. 1 illustrates a schematic circuit diagram of a display panel according to an exemplary embodiment of the disclosure.

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each components in the drawings are only intended to exemplarily illustrate the contents of the disclosure, rather than to demonstrate the practical dimension or proportion of components of the display panel and the display device.

According to a general technical concept of the present disclosure, there is provided a display panel. According to an exemplary embodiment of the disclosure, as illustrated in FIG. 1, the display panel comprises a drive module and a plurality of pixel units 1, and each pixel unit 1 of the plurality of pixel units 1 has a plurality of sub-pixel units 11 and a plurality of image sensing units 12, each of the plurality of sub-pixel units 11 being corresponding to each of the plurality of image sensing units 12 respectively.

Each sub-pixel unit 11 of the plurality of sub-pixel units and each image sensing unit 12 of the plurality of image sensing units are both connected to the drive module, each sub-pixel unit 11 being arranged to be adjacent to an image sensing unit 12 corresponding thereto.

The drive module is configured to drive the plurality of image sensing units 12 so as to take images, and to drive the plurality of sub-pixel units 11 as so to display the images.

In the embodiment, an image sensing unit 12 is provided in each sub-pixel unit 11 and each image sensing unit 12 is connected with a drive module which may control the image sensing unit 12 to sense external images, i.e., to take images/photos of external images. The image sensing unit 12 may produce/induce a current signal when it senses lights from external images, and send such current signal towards the drive module which then converts the current signal into a digital signal, and depending on such digital signal, controls the plurality of sub-pixel units 11 to display the images taken by the image sensing unit 12. As such, it is not necessary to provide a camera on a display device, resulting in a decreased cost. Meanwhile, since the provision of the camera is cancelled, it is also possible to decrease a thickness of the display device such that the display device may become slimmer.

As illustrated in FIG. 1, for example, the display panel comprises a plurality of pixel units 1, each of which comprises a plurality of sub-pixel units 11 (e.g., three sub-pixel units 11 as illustrated), each sub-pixel unit emitting a light of a single color. By way of example, the three sub-pixel units 11 are capable of emitting lights of red, green and blue, respectively. The lights emitted by the three sub-pixel units 11 are controlled by the drive module, so as to obtain a color of a single pixel unit 1. Colors displayed by the plurality of pixel units 1 form for example a complete integral image. Each sub-pixel unit 11 corresponds to an image sensing unit 12; while each image sensing unit 12 is arranged just to be adjacent to rather than being in contact with each corresponding sub-pixel unit 11. Therefore, each image sensing unit 12 and its adjacent sub-pixel unit 11 may operate individually and independently, without influencing each other.

Figure 2:
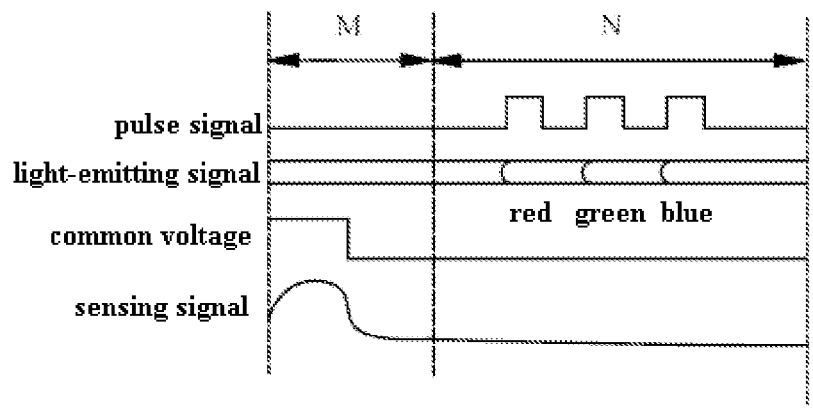
FIG. 2 illustrates a schematic timing (sequence) chart of a display panel when taking and displaying images, according to an exemplary embodiment of the disclosure.

As illustrated in FIG. 2, by way of example, upon processes of taking images and displaying images, the display panel of the exemplary embodiment of the disclosure, may have a plurality of operation period, each of which may for example comprises a sensing time period M and a displaying time period N.

During the sensing time period M, the drive module drives the plurality of image sensing units 12 to sense external images. Meanwhile, the plurality of sub-pixel units 11 are in non-operating condition. The plurality of image sensing units 12 may produce sensing signals upon sensing external images.

During the displaying time period N, the drive module transmits pulse signals towards the plurality of sub-pixel units in response to and depending on the sensing signals so as to control operation of the plurality of sub-pixel units 11. Meanwhile, the plurality of image sensing units 12 are in non-operating condition. By way of example, the drive module drives the plurality of sub-pixel units 11 so as to display the images taken by the plurality of image sensing units 12.

By controlling operations of the plurality of image sensing units 12 during the sensing time period M, operations of the plurality of sub-pixel units 11 are also controlled during the displaying time period N, such that each image sensing unit 12 and adjacent sub-pixel unit 11 may operate individually and independently, without influencing each other.

In an exemplary embodiment, the drive module may comprise a timing controller, a gate line integrated circuit, a data line integrated circuit and an image sensing read-out line integrated circuit.

The timing controller is electrically connected with the gate line integrated circuit, the data line integrated circuit, the image sensing read-out line integrated circuit; and the gate line integrated circuit and the image sensing read-out line integrated circuit are electrically connected with each of the plurality of image sensing units 12, while the gate line integrated circuit and the data line integrated circuit are electrically connected with each of the plurality of sub-pixel units 11.

The timing controller transmits pulse signals to the gate line integrated circuit and the image sensing read-out line integrated circuit once sensing the start of the sensing time period M; the gate line integrated circuit controls the plurality of image sensing units 12 to sense external images, and the image sensing read-out line integrated circuit reads the external images sensed by the plurality of image sensing units 12; and then the timing controller transmits pulse signals again to the gate line integrated circuit and the image sensing read-out line integrated circuit once sensing the terminal of the sensing time period M, so as to control the gate line integrated circuit and the image sensing read-out line integrated circuit to stop operating.

The timing controller transmits pulse signals to the gate line integrated circuit and the data line integrated circuit once sensing the start of the displaying time period N; the gate line integrated circuit turns on/enables the plurality of sub-pixel units 11 and the data line integrated circuit controls the plurality of sub-pixel units 11 to display images; and then the timing controller transmits pulse signals again to the gate line integrated circuit and the read-out line integrated circuit once sensing the terminal of the displaying time period N, so as to control the gate line integrated circuit and the read-out line integrated circuit to stop operating.

By transmitting pulse signals to corresponding integrated circuits during corresponding time period(s) from the timing controller, the plurality of image sensing units 12 and the plurality of sub-pixel units 11 operate individually and independently, without influencing each other. Meanwhile, when the display panel is used to display videos thereon for viewing rather than taking images, the plurality of image sensing units 12 are in non-operating condition, while the plurality of sub-pixel units 11 operate normally so as to display images on the display panel without influencing the display effects thereof.

As illustrated in FIG. 1, the display panel further comprises a plurality of gate lines A, a plurality of data lines B and a plurality of read-out lines C.

The gate line integrated circuit is electrically connected with the plurality of gate lines A, the data line integrated circuit is electrically connected with the plurality of data lines B, and the image sensing data line read-out integrated circuit is electrically connected with the plurality of read-out lines C.

Each image sensing unit 12 is connected to two adjacent gate lines A and to one adjacent read-out line C. And each sub-pixel unit 11 is connected to one of the two adjacent gate lines A and to one adjacent data line C.

By connections between the plurality of gate lines A, the plurality of data lines B, the plurality of read-out lines C and their respective integrated circuits corresponding thereto, the plurality of image sensing units 12 may be controlled to sense external images and to control the plurality of sub-pixel units 11 to emit lights of corresponding colors.

Figures 3, 4:
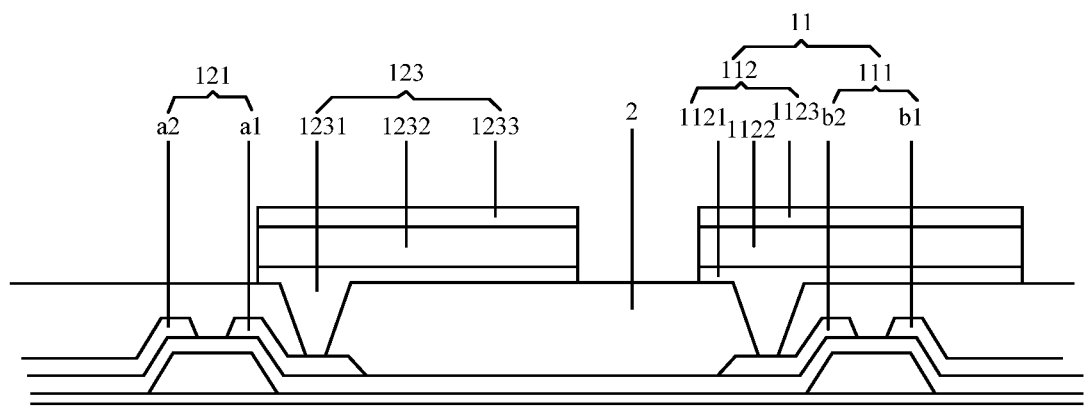
FIG. 3 illustrates a schematic partial sectional view of the display panel according to an exemplary embodiment of the disclosure.
FIG. 4 illustrates a flow chart of a method for making the display panel according to an exemplary embodiment of the disclosure.

Optionally, as illustrated in FIG. 1 and FIG. 3, each image sensing unit 12 comprises a first transistor 121, a second transistor 122 and an image sensing layer 123.

A gate of the first transistor 121 is connected to its adjacent first gate line A1, a first electrode a1 of the first transistor 121 is connected to the image sensing layer 123 and a second electrode a2 of the first transistor 121 is connected to a common electrode of the display panel.

A first electrode of the second transistor 122 is connected to the image sensing layer 123, a second electrode of the second transistor 122 is connected to its one adjacent read-out line C, and a gate of the second transistor 122 is connected to its adjacent second gate line A2.

The timing controller transmits pulse signals towards the gate line integrated circuit and the image sensing read-out integrated circuit once sensing the start of the sensing time period M. And the gate line integrated circuit receives the pulse signals and then transmits high level signals towards the plurality of gate lines A so as to control each of the first transistors 121 and each of the second transistors 122 both of which are connected with each image sensing layer 123, to implement conduction thereamong, such that each image sensing layer 123 is electrically connected and conducted with the common electrode and the read-out line C. The common electrode then outputs a common voltage to each image sensing layer 123 to control the latter to sense external images and to produce a current signal, so as to transmit the current signal to the read-out line C. Next, the image sensing read-out integrated circuit receives pulse signals transmitted by the timing controller, so as to begin reading current signals from the plurality of read-out lines C.

The timing controller transmits pulse signals again towards the gate line integrated circuit and the image sensing read-out integrated circuit once sensing the terminal of the sensing time period M. And the gate line integrated circuit receives the pulse signals to stop transmitting high level signals towards the plurality of gate lines A, so as to control each of the first transistors 121 which is connected with each image sensing layer 123 to implement turn-off of the first transistor(s), to control each image sensing layer 123 to stop sensing external images. The image sensing read-out integrated circuit receives pulse signals transmitted by the timing controller and stops reading current signals from the plurality of read-out lines C, so as to convert the read current signals to digital signals and to send such digital signals to the data line integrated circuit.

In an exemplary embodiment, the first electrode a1 of the first transistor 121 is a source or a drain electrode, for example; correspondingly, the second electrode a2 of the first transistor 121 is a drain or source electrode, for example. The first electrode of the second transistor 122 is a source or a drain electrode, for example; correspondingly, the second electrode of the second transistor 122 is a drain or source electrode, for example.

In an exemplary embodiment, as illustrated in FIG. 3, by way of example, the image sensing layer 123 comprises a first electrode layer 1231, a quantum film layer 1232 and a second electrode layer 1233. The quantum film layer 1232 is located between the first electrode layer 1231 and the second electrode layer 1233, the first electrode layer 1231 is connected with the first electrode a1 of the first transistor 121 and the first electrode of the second transistor 122 respectively, and the first electrode layer 1231 and the second electrode layer 1233 are connected with both ends of a power supply respectively.

The quantum film layer 1232 is provided with a strong capacity in absorption of photon and a quick photon absorption rate; and is also provided with a fine photosensitivity in low-light environment; and may take images stably thereby with little image distortion when taking images on high-speed moving objects; and may also be capable of absorbing visible light and infrared light, and thus some invisible light; and may also be capable of absorbing photons of various color lights. Therefore, the quantum film layer 1232 may function as a good photosensitive material and is thus capable of obtaining good effects of sensing external images. When there is a voltage difference between the first electrode layer 1231 and the second electrode layer 1233, then sensed optical signals may be converted to current signals.

In an exemplary embodiment, for example, the first electrode layer 1231 may be a cathode layer and then the second electrode layer 1233 is an anode layer; alternatively, the first electrode layer 1231 may be an anode layer and then the second electrode layer 1233 is a cathode layer.

In an exemplary embodiment, as illustrated in FIG. 1 and FIG. 3, each sub-pixel unit 11 comprises a third transistor 111 and a display layer 112.

A gate of the third transistor 111 is connected to its adjacent gate line A1, a first electrode b1 of the third transistor 111 is connected to its one adjacent data line B, and a second electrode b2 of the third transistor 111 is connected to the display layer 112.

The timing controller transmits pulse signals towards the gate line integrated circuit and the data line integrated circuit once sensing the start of the displaying time period N. And the gate line integrated circuit receives the pulse signals and then transmits high level signals towards the plurality of gate lines A so as to control each of the third transistors 111 connected with the plurality of gate lines A to conduct therethrough, such that the display layer 112 connected with each third transistor 111 is electrically connected and conducted with the data line B. And the data line integrated circuit receives the pulse signals and controls corresponding display layer 112 to display images depending on the digital signals converted by the image sensing read-out line integrated circuit, so as to further display external images sensed by the plurality of image sensing units 12.

The timing controller transmits pulse signals again towards the gate line integrated circuit and the data line integrated circuit once sensing the terminal of the sensing time period N. And the gate line integrated circuit receives the pulse signals to stop transmitting high level signals towards the plurality of gate lines A, so as to turn off each of the third transistors 111 which is connected with the plurality of gate lines A. And the data line integrated circuit receives the pulse signals to control corresponding display layer 112 to stop displaying images.

In an exemplary embodiment, the first electrode b1 of the third transistor 111 is a source or a drain electrode, for example; correspondingly, the second electrode b2 of the third transistor 111 is a drain or source electrode, for example.

In an exemplary embodiment, as illustrated in FIG. 3, the display layer 112 comprises a third electrode layer 1121, a light-emitting layer 1122 and a fourth electrode layer 1123. The light-emitting layer 1122 is located between the third electrode layer 1121 and a fourth electrode layer 1123; the third electrode layer 1121 is connected to the second electrode b2 of the third transistor 111, while the third electrode layer 1121 and the fourth electrode layer 1123 are connected with both ends of the power supply respectively.

When the third transistor 111 is conducted therethrough, there will be a voltage generated between the third electrode layer 1121 and the fourth electrode layer 1123, and furthermore there will be lights of corresponding colors emitted from the light-emitting layer 1122 located between the third electrode layer 1121 and the fourth electrode layer 1123, e.g., red light, green light and blue light may be emitted therefrom In an exemplary embodiment, the third electrode layer 1121 is a cathode layer, for example, and meanwhile the fourth electrode layer 1123 is an anode layer, for example; alternatively, the third electrode layer 1121 is an anode layer, for example, and meanwhile the fourth electrode layer 1123 is a cathode layer.

In an exemplary embodiment, as illustrated in FIG. 3, the display panel further comprises a passivation layer 2 which is for example located above the first transistor 121, the second transistor 122 and the third transistor 111 and located below the image sensing layer 123 and the display layer 112, and may function to protect the first transistor 121, the second transistor 122 and the third transistor 111.

According to this embodiment, each sub-pixel unit 11 is provided with an image sensing unit 12 therein, and each image sensing unit 12 is connected to the drive module which is capable of controlling the image sensing unit 12 to sense external images, i.e., to take images of external images. The image sensing unit 12 may produce a current signal when it senses lights from external images, and send such current signal towards the drive module which then converts the current signal into a digital signal, and depending on such digital signal, controls the plurality of sub-pixel units 11 to display the images taken by the image sensing unit 12. As such, it is not necessary to provide an additional camera on a display device, resulting in a decreased cost. Meanwhile, since the provision of the additional camera is cancelled, it is also possible to decrease a thickness of the display device such that the display device may become slimmer.

According to another aspect of the disclosure, a display device is provided. In an exemplary embodiment, for example, the display device comprises the display panel according to any one of above embodiments.

According to yet another aspect of the disclosure, a method for making the display panel is provided. In an exemplary embodiment, as illustrated in FIG. 4, the method comprises:

Step 101: forming a plurality of sub-pixel units 11 and a plurality of image sensing units 12 within an area corresponding to each pixel unit 1 on a substrate, the plurality of sub-pixel units 11 being corresponding to the plurality of the image sensing units 12 respectively, and each sub-pixel unit 11 being arranged to be adjacent to its corresponding image sensing unit 12;

Step 102: connecting each of the plurality of the sub-pixel units 11 with a drive module, and connecting each of the plurality of image sensing units 12 with the drive module.

In an exemplary embodiment, the method for making the display panel further comprises following steps:

Providing a plurality of gate lines A electrically connected with the gate line integrated circuit of the drive module, a plurality of data lines B electrically connected with the data line integrated circuit of the drive module and a plurality of read-out lines C electrically connected with the image sensing read-out line integrated circuit of the drive module.

Each image sensing unit 12 is connected to its two adjacent gate lines A, and each image sensing unit 12 is connected to its one adjacent read-out line C;

Each sub-pixel unit 11 is connected to its one adjacent gate line A, and each sub-pixel unit 11 is connected to its one adjacent data line B.

Figure 5:
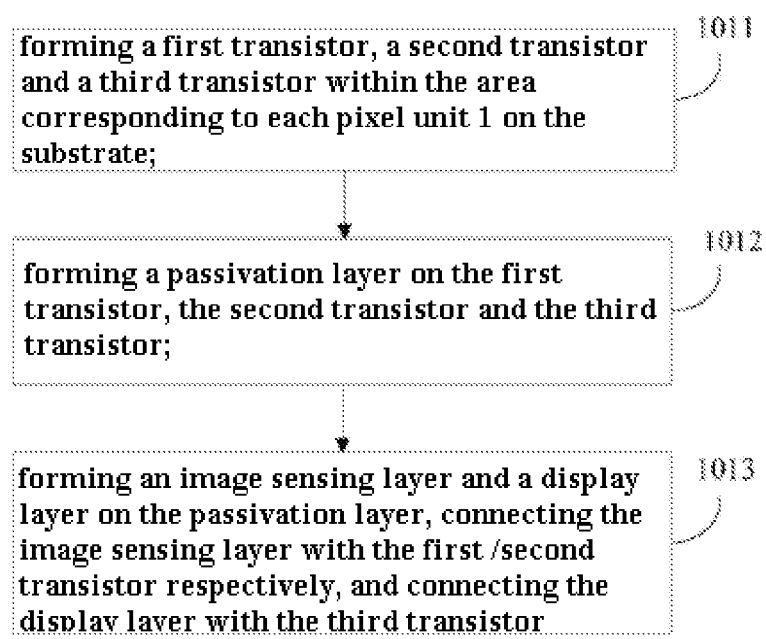
FIG. 5 illustrates a flow chart of a method for making the display panel according to another exemplary embodiment of the disclosure.

In an exemplary embodiment, as illustrated in FIG. 5, by way of example, the step 101 comprises following sub-steps:

Sub-step 1011: as illustrated in FIGS. 1 and 3, forming a first transistor 121, a second transistor 122 and a third transistor 111 within the area corresponding to each pixel unit 1 on the substrate;

Sub-step 1012: as illustrated in FIG. 3, forming a passivation layer 2 on the first transistor 121, the second transistor 122 and the third transistor 111; and Sub-step 1013: as illustrated in FIG. 3, forming an image sensing layer 123 and a display layer 112 on the passivation layer 2, and connecting the image sensing layer 123 with the first transistor 121 and the second transistor 122 respectively and connecting the display layer 112 with the third transistor 111.

In an exemplary embodiment, for example, when forming the first transistor 121, the second transistor 122 and the third transistor 111, a plurality of gate lines A, a plurality of data lines B and a plurality of read-out lines C are formed simultaneously; and the gate of the first transistor 121 is connected to its adjacent first gate line A1, the gate of the second transistor 122 is connected to its adjacent second gate line A2, and the gate 1 of the third transistor 111 is connected to its adjacent first gate line A1 while one electrode of the second transistor 122 is connected to its one adjacent read-out line C.

The first transistor 121, the second transistor 122 within an area corresponding to each pixel unit 1 on a substrate, and the image sensing layer 123 which is connected with the first transistor 121 and the second transistor 122 respectively cooperate collectively to form an image sensing unit 12; the third transistor 111 and the display layer 112 which is connected with the third transistor 111 cooperate collectively to form a sub-pixel unit 11.

In an exemplary embodiment of the disclosure, as illustrated in FIG. 3, for example, the step of forming the image sensing layer 123 and the display layer 112 on the passivation layer 2 comprises:

forming a first electrode layer 1231 and a third electrode layer 1121 on the passivation layer 2, and connecting the first electrode layer 1231 with the first transistor 121 and the second transistor 122 respectively, and connecting the third electrode layer 1121 with the third transistor 111;

forming a quantum film layer 1232 on the first electrode layer 1231;

forming a light-emitting layer 1122 on the third electrode layer 1121; and forming a second electrode layer 1233 on the quantum film layer 1232 and forming a fourth electrode layer 1123 on the light-emitting layer 1122.

In an exemplary embodiment of the disclosure, e.g., by forming three via-holes on the passivation layer 2, the first electrode layer 1231 is connected with the first transistor 121 via one via-hole on the passivation layer 2, and connected with the second transistor 122 via anther via-hole on the passivation layer 2; while the third electrode layer 1121 is connected with the third transistor 111 via yet another via-hole on the passivation layer 2.

In an exemplary embodiment of the disclosure, by way of example, the first electrode layer 1231 and the third electrode layer 1121 are formed simultaneously by a mask exposure process.

In an exemplary embodiment of the disclosure, by way of example, the quantum film layer 1232 is also formed by a mask exposure process.

In an exemplary embodiment of the disclosure, by way of example, the light-emitting layer 1122 is also formed by a mask exposure process.

In an exemplary embodiment of the disclosure, by way of example, the second electrode layer 1233 and the fourth electrode layer 1123 are formed simultaneously by a mask exposure process.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present disclosure exemplarily, and should not be deemed as a restriction thereof.

Although several exemplary embodiments of the general concept of the present disclosure have been shown and described, it would be appreciated by those skilled in the art that various changes or modifications may be made in these embodiments without departing from the principles and spirit of the disclosure and lie within the scope of present application, which scope is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A display panel, comprising:
   a drive module that comprises a timing controller, a gate line integrated circuit, a data line integrated circuit, and an image sensing read-out line integrated circuit;
   a plurality of pixel units;
   a plurality of gate lines;
   a plurality of data lines; and
   a plurality of read-out lines,
   wherein each pixel unit of the plurality of pixel units has a plurality of sub-pixel units and a plurality of image sensing units, each of the plurality of sub-pixel units corresponding to each of the plurality of image sensing units respectively;
   wherein each sub-pixel unit of the plurality of pixel units and each image sensing unit of the plurality of image sensing units are connected to the drive module, each sub-pixel unit being arranged to be adjacent to an image sensing unit corresponding thereto; and
   wherein the drive module is configured to drive the plurality of image sensing units so as to take images, and to drive the plurality of sub-pixel units so as to display the images; and
   wherein each image sensing unit is connected to two adjacent gate lines and to one adjacent read-out line; and
   wherein each sub-pixel unit is connected to one of the two adjacent gate lines and to one adjacent data line; and
   wherein the timing controller is electrically connected with the gate line integrated circuit, the data line integrated circuit, and the image sensing read-out line integrated circuit, and
   wherein the gate line integrated circuit is electrically connected with the plurality of gate lines, the data line integrated circuit is electrically connected with the plurality of data lines, and the image sensing read-out line integrated circuit is electrically connected with the plurality of read-out lines.

2. The display panel according to claim 1, wherein each image sensing unit comprises a first transistor, a second transistor and an image sensing layer;
   wherein a gate of the first transistor is connected to the one of the two adjacent gate lines, a first electrode of the first transistor is connected to the image sensing layer and a second electrode of the first transistor is connected to a common electrode of the display panel; and
   wherein a first electrode of the second transistor is connected to the image sensing layer, a second electrode of the second transistor is connected to the one read-out line and a gate of the second transistor is connected to the other one of the two adjacent gate lines.

3. The display panel according to claim 2, wherein the image sensing layer comprises a first electrode layer, a quantum film layer and a second electrode layer, and wherein:
   the quantum film layer is located between the first electrode layer and the second electrode layer,
   the first electrode layer is connected with the first electrode of the first transistor and the first electrode of the second transistor respectively, and
   the first electrode layer and the second electrode layer are connected with both ends of a power supply respectively.

4. The display panel according to claim 1, wherein each sub-pixel unit comprises a third transistor and a display layer, and
   wherein a gate of the third transistor is connected to the one of the two adjacent gate lines, a first electrode of the third transistor is connected to the one adjacent data line, and a second electrode of the third transistor is connected to the display layer.

5. The display panel according to claim 4 wherein the display layer comprises a third electrode layer, a light-emitting layer, and a fourth electrode layer, and wherein:
   the light-emitting layer is located between the third electrode layer and the fourth electrode layer,
   the third electrode layer is connected to the second electrode of the third transistor; and
   the third electrode layer and fourth electrode layer are connected with both ends of a power supply respectively.

6. A display device, comprising the display panel according to claim 1.

7. A method for making a display panel, comprising steps of:
   forming a plurality of sub-pixel units and a plurality of image sensing units within an area corresponding to each pixel unit on a substrate, the plurality of sub-pixel units corresponding to the plurality of the image sensing units respectively, and each sub-pixel unit being arranged adjacent to its corresponding image sensing unit; and
   connecting each of the plurality of the sub-pixel units with a drive module,
   connecting each of the plurality of image sensing units with the drive module; and
   electrically connecting a plurality of gate lines with a gate line integrated circuit of the drive module;
   electrically connecting a plurality of data lines with a data line integrated circuit of the drive module; and
   electrically connecting a plurality of read-out lines with an image sensing read-out line integrated circuit of the drive module;

wherein each image sensing unit is connected to its two adjacent gate lines, and each image sensing unit is connected to its one adjacent read-out line, and each sub-pixel unit is connected to its one adjacent gate line, and each sub-pixel unit is connected to its one adjacent data line, wherein the step of forming the plurality of sub-pixel units and the plurality of image sensing units within the area corresponding to each pixel unit on the substrate comprises:

forming a first transistor, a second transistor and a third transistor within the area corresponding to each pixel unit on the substrate;

forming a passivation layer on the first transistor, the second transistor and the third transistor; and forming an image sensing layer and a display layer on the passivation layer, and connecting the image sensing layer with the first transistor and the second transistor respectively and connecting the display layer with the third transistor.

8. The method according to claim 7, wherein the step of forming the plurality of sub-pixel units and the plurality of image sensing units within the area corresponding to each pixel unit on the substrate comprises:

forming a plurality of gate lines, a plurality of data lines and a plurality of read-out lines simultaneously when forming the first transistor, the second transistor and the third transistor.

9. The method according to claim 7, wherein the step of forming the image sensing layer and the display layer on the passivation layer comprises:

forming a first electrode layer and a third electrode layer on the passivation layer, and connecting the first electrode layer with the first transistor and the second transistor respectively, and connecting the third electrode layer with the third transistor;

forming a quantum film layer on the first electrode layer;

forming a light-emitting layer on the third electrode layer; and forming a second electrode layer on the quantum film layer and forming a fourth electrode layer on the light-emitting layer.

10. The method according to claim 7, wherein the image sensing layer is formed by a mask exposure process.

* * * * *